United States Patent [19]

Opris et al.

[11] Patent Number: 6,054,886
[45] Date of Patent: Apr. 25, 2000

[54] REFERENCE BUFFER TECHNIQUE FOR HIGH SPEED SWITCHED CAPACITOR CIRCUITS

[75] Inventors: Ion E. Opris, Cupertino; Laurence Douglas Lewicki, Sunnyvale, both of Calif.

[73] Assignee: National Semiconductor Corporation, Santa Clara, Calif.

[21] Appl. No.: 08/932,992

[22] Filed: Sep. 18, 1997

[51] Int. Cl.$^7$ ...................................................... H03K 17/16
[52] U.S. Cl. .......................... 327/304; 327/108; 327/561; 326/27
[58] Field of Search ...................................... 327/304, 560, 327/108, 544, 551, 561, 311; 326/27, 26

[56] References Cited

U.S. PATENT DOCUMENTS

5,517,130  5/1996  Sandhu ........................................ 326/27

*Primary Examiner*—Dinh T. Le
*Attorney, Agent, or Firm*—Limbach & Limbach L.L.P.

[57] ABSTRACT

A low power reference buffer includes a new amplifier design with very large transconductance and high frequency non-dominant poles and a triple bonding scheme to a large off-chip capacitor that avoids the problems related to the lead wire inductance.

28 Claims, 5 Drawing Sheets

REFERENCE BUFFER TECHNIQUE FOR HIGH SPEED SWITCHED CAPACITOR CIRCUITS

BACKGROUND OF THE INVENTION

1. Field of the Invention

The present invention relates to the field of reference buffers. More particularly, the present invention relates to a low power reference buffer including an amplifier with very large transconductance and high frequency non-dominant poles and a triple bonding configuration to a large off-chip capacitor that avoids problems related to the lead wire inductance.

2. Description of the Related Art

Many of the newer analog-to-digital (A/D) converters and other switched capacitor integrated circuits (ICs) have a reference buffer integrated on the chip. This approach increases the chip's functionality, reducing the external component count and the overall system cost.

Figure 1:
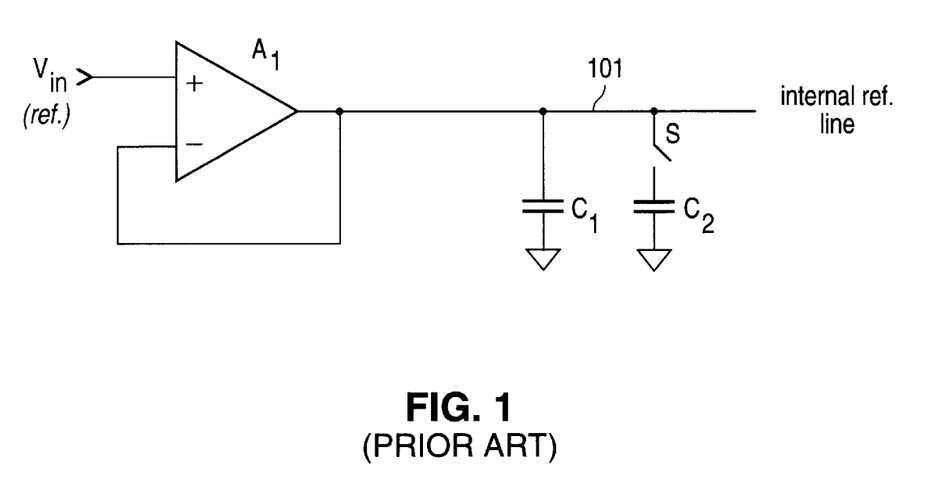
FIG. 1 illustrates a conventional reference buffer.

FIG. 1 illustrates a conventional reference buffer. As shown, a reference buffer $A_1$ is connected between the reference input $V_{in}$ and the internal reference line 101. Capacitors $C_1$ and $C_2$ are parasitic capacitance and switching capacitance on that internal reference line 101, respectively. More specifically, the switching capacitance $C_2$ is coupled to the internal reference line 201 by a switch S which is, in turn, controlled by a clock CLK. For conventional high speed, high resolution A/D converter designs, capacitances $C_1$ and $C_2$ are on the order of 10 picoFarads (pF) with a switching speed at approximately 40 MHz. Moreover, the settling time within 0.01% (for a 12-bit A/D converter) when the MOS switch S closes is less than ½ clock cycle or about 12 nanoseconds (ns) or less.

Modeling the reference buffer response with a single dominant pole (exponential settling), the required transconductance gm of the reference buffer is determined by the following expression.

$$g_m = \frac{2\pi \cdot n \cdot (C_1 + C_2)}{T_s} \quad (1)$$

where $T_s$ 12 ns is the maximum settling time; $(C_1+C_2)=20$ pF is the total load capacitance; and n is the number of time constant periods for settling, which, in this case, is 10.

In the above numerical example, the required transconductance gm is in excess of 100 mA/V. It should be noted that Equation (1) does not take into account nonlinear effects for settling (slewing) and the loading of the reference line by the output capacitance of the reference buffer itself.

For high speed circuits, the design requirements of the reference buffer are often achieved with a considerable amount of power dissipation. In practice, a reference buffer cannot be designed in a Complementary Metal-Oxide Semiconductor (CMOS) technology with a power budget below 200–300 mW, which is comparable with the rest of the power dissipation in the analog section of the A/D converter.

Some power savings can be achieved in a bipolar, or BiCMOS technology, because of the inherently larger bipolar transconductance for a given bias current. Even with this more expensive technology, however, power

SUMMARY OF THE INVENTION

In view of the foregoing, the present application discloses a low power reference buffer including an amplifier with very large transconductance and high frequency non-dominant poles and a triple bonding scheme to a large off-chip capacitor that avoids the problems related to the lead wire inductance.

In particular, an apparatus including a reference buffer in accordance with one embodiment of the present invention includes a first amplifier having first and second input terminals and an output terminal, the first amplifier first input terminal configured to receive a first reference signal; a common node; a first inductance coupled between the first amplifier output terminal and the common node; a second inductance coupled between the first amplifier second input terminal and the common node; and a third inductance coupled to the common node; where the first inductance and the second inductance separate the first amplifier output terminal, and the first amplifier second input terminal, respectively, from the common node.

An apparatus including a reference buffer in accordance with another embodiment of the present invention further includes a second amplifier having a second amplifier first input terminal, a second amplifier second input terminal and a second amplifier output terminal; where the second amplifier output terminal and the second amplifier second input terminal are coupled to the third inductance such that the second amplifier output terminal and second amplifier second input terminal are separated from said common node; and further, where the second amplifier first input terminal is configured to receive a second reference signal.

An the voltage gain amplifier of the apparatus including a reference buffer in accordance with yet another embodiment of the present invention includes a first input transistor having first, second and third terminals, the first input transistor first terminal configured to receive a first input signal and the first input transistor second terminal configured to receive a first bias signal; a second input transistor having first, second and third terminals, the first input transistor first terminal configured to receive a second input signal and the second input transistor second terminal configured to receive a second bias signal; and a plurality of diodes coupled to the second terminals of the first and second input transistors; where the second input transistor third terminal is coupled to the first input transistor third terminal, the third terminals further configured to receive a third bias signal.

These and other features and advantages of the present invention will be understood upon consideration of the following detailed description of the invention and the accompanying drawings.

DESCRIPTION OF THE PREFERRED EMBODIMENT

Figure 2:
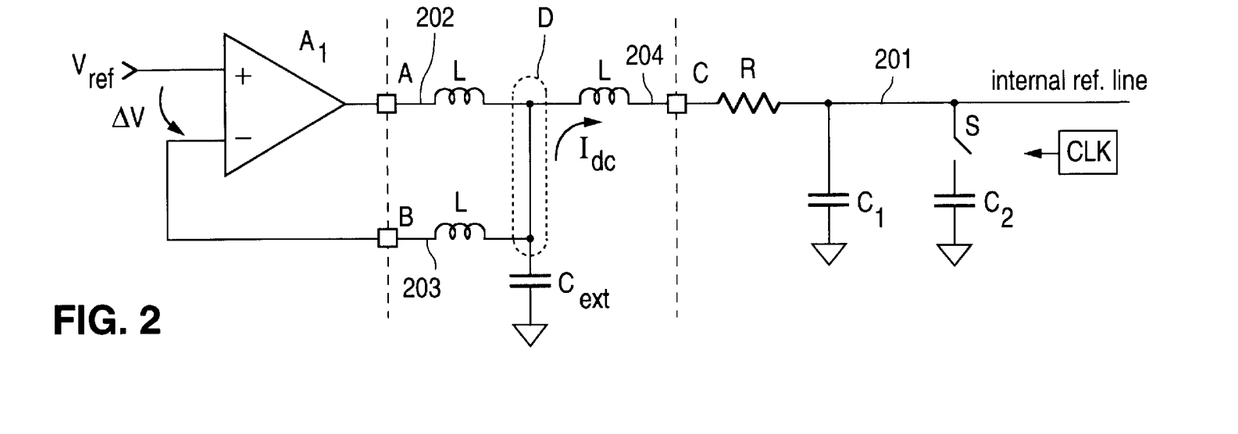
FIG. 2 illustrates a reference buffer in accordance with one embodiment of the present invention.

FIG. 2 illustrates a reference buffer configuration in accordance with one embodiment of the present invention. As shown, a reference buffer $A_1$ receives an input reference signal Vref at its non-inverting input while the inverting input is coupled to bonding wire 203. Additionally, the output of the reference buffer $A_1$ is coupled to bonding wire 202. There is also provided a third bonding wire 204 which is coupled to both of the first two bonding wires 202 and 203. In this manner, a first end of each of the three bonding wires 202, 203, and 204 share a common node D. Also coupled to the common node D is an external capacitor $C_{ext}$. The output terminal of the reference buffer $A_1$ is coupled to a second end of bonding wire 202 while the second end of bonding wire 204 is coupled to a resistor R in series thereto, to which is further coupled an internal reference line 201.

Accordingly, the external capacitor $C_{ext}$ is used as a large charge reservoir for charging and discharging of a switched capacitor $C_2$ which is separated from the internal reference line 201 by a switch S (for example, a MOS switch). A controller such as a clock CLK drives the switch to alternately couple the switched capacitor $C_2$ to the internal reference line 201. Also shown in FIG. 2 is an on-chip parasitic capacitance $C_1$ which, as illustrated, is effectively in parallel with the switched capacitor $C_2$.

Since the external capacitor $C_{ext}$ has a large charge compared with the charged transferred to switched capacitor $C_2$ in each clock cycle, the reference buffer $A_1$ does not have to supply this charge in each cycle, but merely maintain an average voltage on the external capacitor $C_{ext}$ equal to the input reference signal Vref. Therefore reference buffer $A_1$ can be slow, which in turn permits very little power dissipation in the design of the reference buffer in accordance with the present invention.

Moreover, there is a dc component Idc of the current flowing out of external capacitor $C_{ext}$ which is signal dependent. This dc component is generally expressed as the following:

$$I_{dc} = C_2 \cdot V_{ref} f_{clk} \quad (2)$$

Where $f_{clk}$ is the frequency of the clock CLK, and which, as shown in FIG. 2, drives the switch S.

However, the switched capacitor $C_2$ is not a fixed value because it sums up all the capacitors switched on the internal reference line 201 in any given cycle. These switched capacitors are signal dependent, and, in the case of a pipelined A/D converter, their number (and size) depend upon the conversion code through the analog residue passed from stage to stage in the pipeline architecture. The initial voltage on these capacitors before closing switch S is also signal dependent. This is true also for other switched capacitor circuits such as filters.

On the one hand, switched capacitor $C_2$ can have a maximum value, and, at each cycle, is completely discharged before the closing of the switch S. On the other hand, switched capacitor $C_2$ can either have a very small value or its initial voltage can be very close to reference voltage $V_{ref}$ such that the charge transfer is negligible. In other words, Equation (2) provides the worst case variation in this dc component.

Moreover, according to the present invention, the dc voltage level on the external capacitor $C_{ext}$ is maintained at an average value independent of the dc current consumption from the internal reference line 201.

Signal independent errors such as those due to reference buffer $A_1$ input offset or finite loop gain are reflected in the A/D converter as an overall gain (full scale) error, and can be corrected by known calibration techniques. Reference voltage dependence on the signal (or the output code), however, generates non-linear distortion. If the voltage drop $\Delta V$ of the external capacitor $C_{ext}$ level over the worse case variation of the dc current component is limited to ½ LSB, the required dc transconductance gm of reference buffer $A_1$ is given by the following expression.

$$g_m = \frac{I_{dc}}{\Delta} V = 2^{N+1} \cdot C_2 \cdot f_{clk} \quad (3)$$

Where N is the number of bits of resolution of the pipelined A/D converter.

With values of N=12, capacitance $C_2$ of 10 pF, and the frequency of the clock $f_{clk}$ of 40 MHz, the necessary transconductance gm of reference buffer $A_1$ is approximately 3.3 A/V. This large transconductance gm can be achieved with very little power dissipation in a multi-stage design.

Since the reference buffer $A_1$ is slow, it cannot respond on a cycle by cycle basis. Therefore, the external capacitor $C_{ext}$ must be sufficiently large to provide the charge for the switched capacitor $C_2$ during several cycles with no significant decrease in the dc voltage. This condition translates to the following expression:

$$C_{ext} >> 2^{N+2} \cdot C_2 \quad (4)$$

where a typical value of the external capacitor $C_{ext}$ is 1 μF.

On other hand, using a very large value for the external capacitor $C_{ext}$ is impractical because of the parasitic series inductance and resistance associated with large capacitors which prevent the charge transfer at high clock speeds.

Because of the large value required for this external capacitor $C_{ext}$, it is advantageous to used it also for the compensation of reference buffer $A_1$.

The unity gain bandwidth of reference buffer $A_1$ in accordance with the present invention is calculated from the expression below.

$$f_u = \frac{g_m}{2\pi \cdot C_{ext}} \quad (5)$$

Also shown in FIG. 2 are inductance Ls which represent the bonding wire and package lead inductances. Typical values range from 3 nH to 10 nH depending upon the package. These parasitic inductances L significantly complicate the design. In particular, the output and the feedback input of the reference buffer $A_1$ cannot be connected to the common node D. If, for example, nodes A and B of FIG. 2 are connected together, the inductor-external capacitor series LC tank at the output has an 180 degrees phase shift at the resonant frequency $f_{LC}$ which can be calculated according to the following expression.

$$f_{LC} = \frac{1}{2\pi \cdot \sqrt{L \cdot C}} \quad (6)$$

With values of the transconductance gm of 3.3 A/V, the inductance value of 10nH, an external capacitor $C_{ext}$ of 1 μF, the unity gain bandwidth $f_u$ according to Equation (5) is 500 KHz while the resonant frequency $f_{LC}$ is 1.6 MHz in accordance with Equation (6). In other words, the resonant frequency $f_{LC}$ is much too close to the unity gain frequency $f_u$ of Equation (5) of reference buffer $A_1$ to ensure stability.

Moreover, from noise considerations, coupling nodes A and C together in FIG. 2 is detrimental. The noise generated inside reference buffer $A_1$ is amplified internally and then low pass filtered by external capacitor $C_{ext}$. However, the low pass filtering occurs at external capacitor $C_{ext}$ pin. At the reference buffer output (node A), the inductor-external capacitor LC tank has a high impedance at resonant frequency $f_{LC}$ as given by Equation (6), which is actually within the useful band, and the noise is greatly amplified. Simulations confirm a 30–40 dB increase of the total noise in the band if the internal reference line 201 was connected directly at the reference buffer output (node A).

Additionally, it is preferable to maintain nodes B and C separate, except if triple wire bonds are not possible and the number of available chip pins is limited. Connecting those two nodes (B and C) together has two possible drawbacks: (1) switching noise feedthrough from internal reference line 201 to input reference signal $V_{ref}$ through the parasitic input capacitance of reference buffer A, and, more importantly, (2) the internal propagation of the large switching transients on internal reference line 201 through reference buffer $A_1$.

Since capacitors $C_1$ and $C_2$ have comparable values, the transients on the internal reference line 201 can be as high as ½ of input reference signal $V_{ref}$ in the order of 1 volt or so. This large transient will saturate the input of reference buffer $A_1$ placing it in a non-linear operation region with a long recovery time. Since external capacitor $C_{ext}$ averages the reference buffer $A_1$'s output current, there will be systematic errors between input reference voltage $V_{ref}$ and the output capacitor voltage which are dependent on the transient response.

The initial transient values can be decreased by increasing on-chip capacitance $C_1$. This approach, however, has the following drawback in that this capacitor $C_1$ consumes silicon area and, independent of technology, cannot be made sufficiently large to reduce the transient to an acceptable level. Furthermore, the larger total capacitance $(C_1+C_2)$ also translates into longer settling time because of the parasitic series inductor L.

The resistor R in FIG. 2 is used to damp the transients in the $L(C_1+C_2)$ tank. Critical damping for fast settling occurs for a resistance value given by the following expression.

$$R_{crit} = \sqrt{\frac{4 \cdot L}{C_1 + C_2}} \qquad (7)$$

A resistor value R larger than that of the critical damping resistance $R_{crit}$ as given by Equation (7) ensures no overshoot response.

Figure 3:
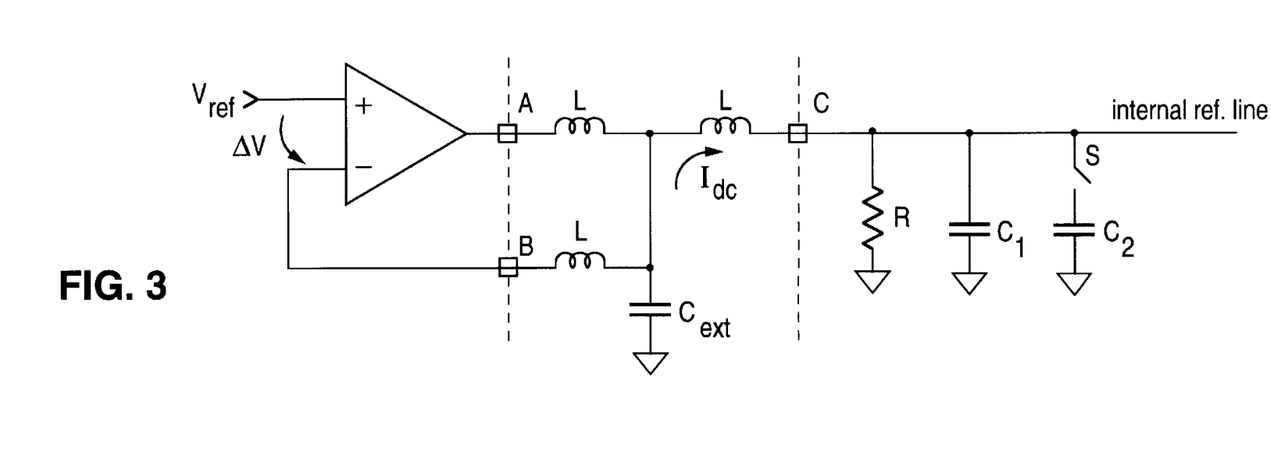
FIG. 3 illustrates a reference buffer in accordance with another embodiment of the present invention.

The damping can also be achieved with a parallel resistor, as shown in FIG. 3. In this case, critical damping occurs for a resistance value given by the following expression.

$$R_{crit} = \sqrt{\frac{L}{4 \cdot (C_1 + C_2)}} \qquad (8)$$

Figure 4:
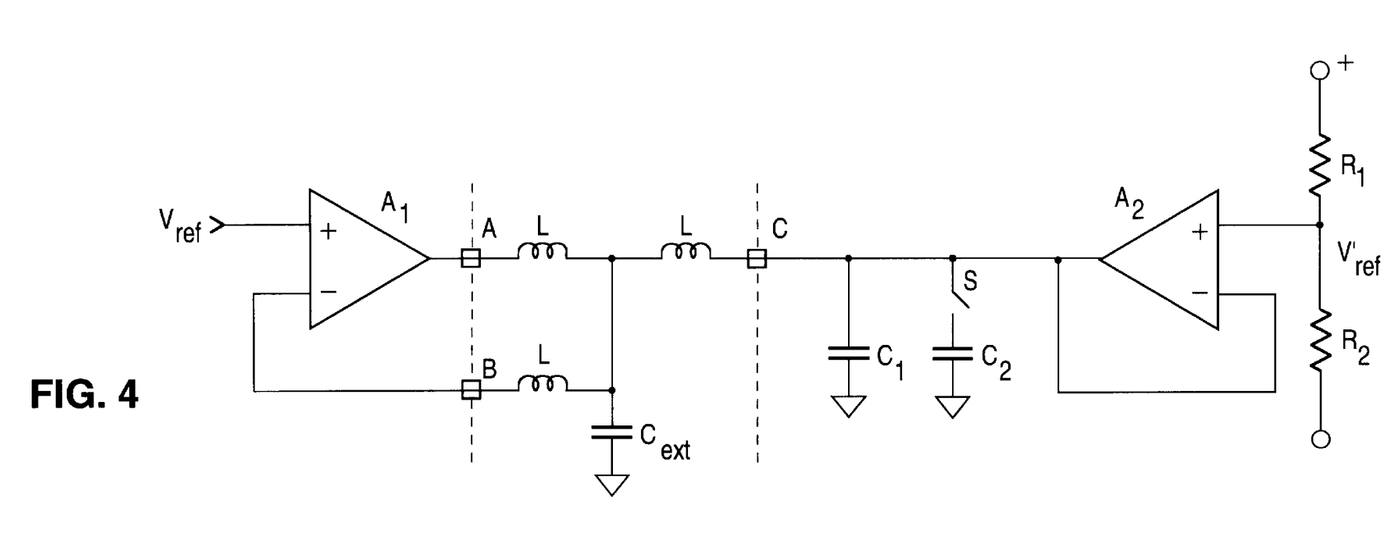
FIG. 4 illustrates a reference buffer in accordance with yet another embodiment of the present invention.

A value of a resistor R smaller than that of the critical damping resistance $R_{crit}$ as given by Equation (8) ensures transients with no overshoot. However, the obvious disadvantage of the parallel damping technique is the continuous power dissipation on the parallel resistor R which usually has a small value as can be seen from Equation (8). The dissipation power can be reduced with active damping as shown in FIG. 4. As shown, the transconductance gm of a second amplifier $A_2$ is given by the following expression.

$$g_m > \sqrt{\frac{4 \cdot (C_1 + C_2)}{L}} \qquad (9)$$

As compared with the reference buffer $A_1$ configuration as illustrated in FIG. 3 with the parallel resistor R, a smaller power dissipation can be achieved in the embodiment as shown in FIG. 4. Since this transconductance gm is about two orders of magnitude lower than the required dc transconductance of reference buffer $A_1$ as given by Equation 3, the second amplifier $A_2$ input offset has a negligible overall effect.

The second amplifier $A_2$ non-inverting input can be connected either to input reference signal $V_{ref}$ or to a replica reference signal $V_{ref}'$ to minimize switching noise feedthrough to the input of the reference buffer $A_1$ through the second amplifier $A_2$ input capacitance. A small voltage difference between input reference signal $V_{ref}$ and its replica $V_{ref}'$ can be tolerated as long as second amplifier $A_2$ is not saturated because this difference is equivalent to the second amplifier $A_2$ input offset and it is attenuated at the internal reference line by the ratio of the transconductance between second amplifier $A_2$ and reference buffer $A_1$.

Figure 5:
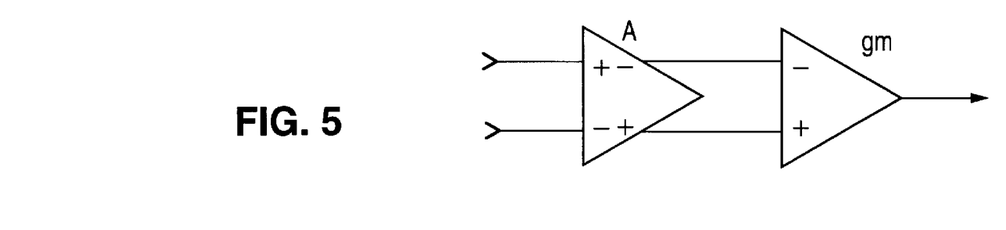
FIG. 5 a block diagram illustrating a fixed voltage gain amplifier followed by an adaptive biasing transconductance stage in accordance with one embodiment of the present invention.

FIG. 5 illustrates a block diagram of a reference buffer in accordance with another embodiment of the present invention. As shown, a fixed voltage gain amplifier A is followed by an adaptive biasing transconductance stage $g_m$. The overall transconductance $gm_{ech}$ is then given by the following expression.

$$gm_{ech} = Agm \qquad (10)$$

Since the reference buffer $A_1$ has a dominant pole determined by the external capacitor $C_{ext}$, all the non-dominant poles on the loop should be at much higher frequencies than the unity gain frequency $f_u$ which is given by Equation (5). This is achieved by implementing the fixed gain amplifier of FIG. 5 by a cascade of low gain cells as shown in FIG. 6 each having a high bandwidth.

Figure 6:
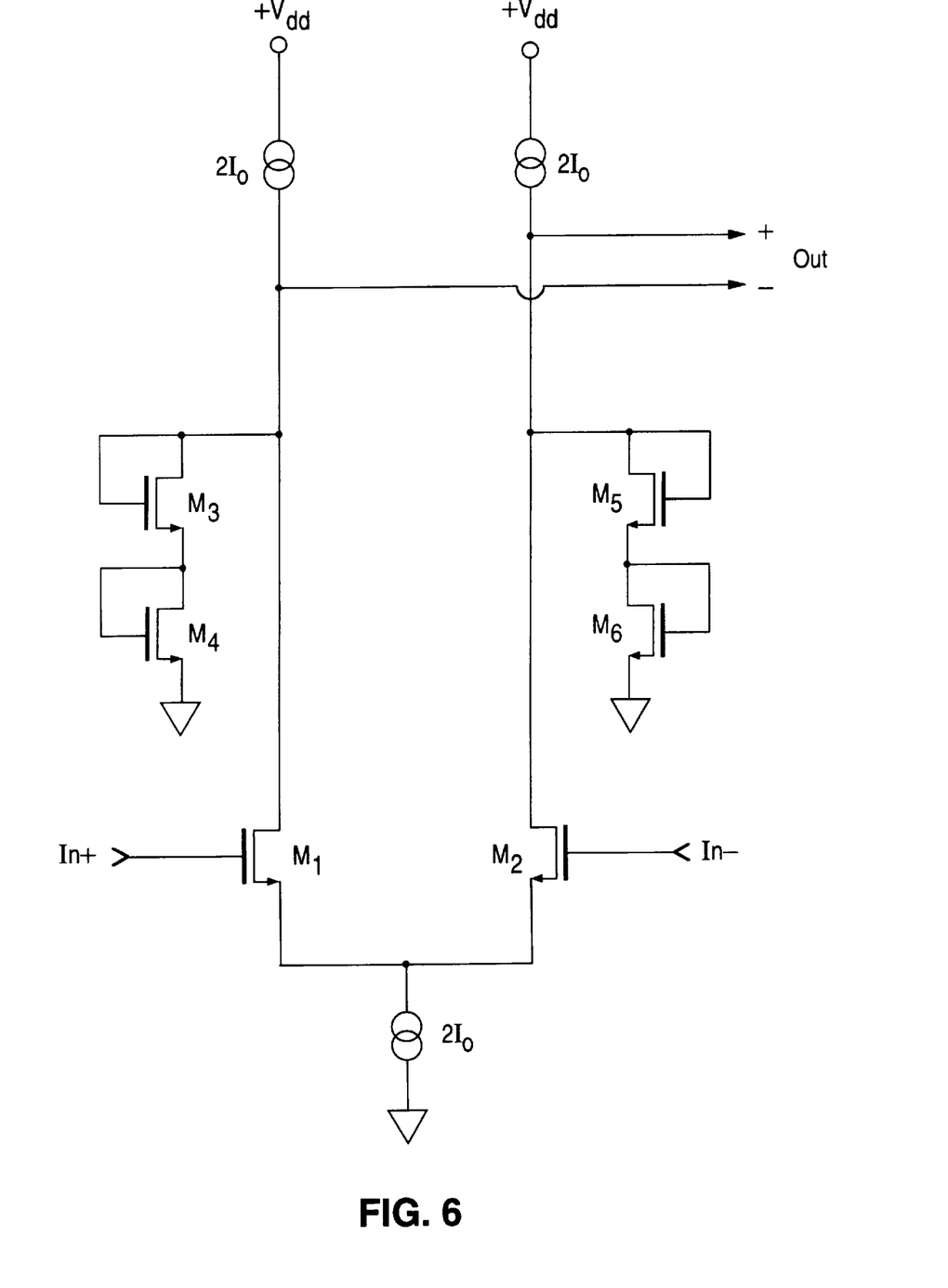
FIG. 6 illustrates a fixed gain amplifier for use with the reference buffer in accordance with one embodiment of the present invention.

As can be seen from FIG. 6, the fixed gain amplifier of FIG. 6 has a gain $A_{stage}$ determined by the ratio of input transistors $M_1$ and $M_2$ and the transconductance of the diode connected load transistors $M_3$–$M_6$ which can be determined by the following expression.

$$A_{stage} = gm1(1/gm3 + 1/gm4) \qquad (11)$$

where gm1, gm3 and gm4 are transconductances of the transistors $M_1$, $M_3$ and $M_4$.

The high bandwidth is achieved because of the low load impedance. Also, because both the gain transistors $M_1$, $M_2$ and the load transistors $M_1$, $M_2$, $M_3$ and $M_4$ are of the same type, the stage gain $A_{stage}$ as given by Equation (11) is insensitive to process and temperature variations.

Therefore, as can be seen from FIGS. 5 and 6, the present invention allows for obtaining a large dc transconductance with minimal power dissipation.

Figure 7:
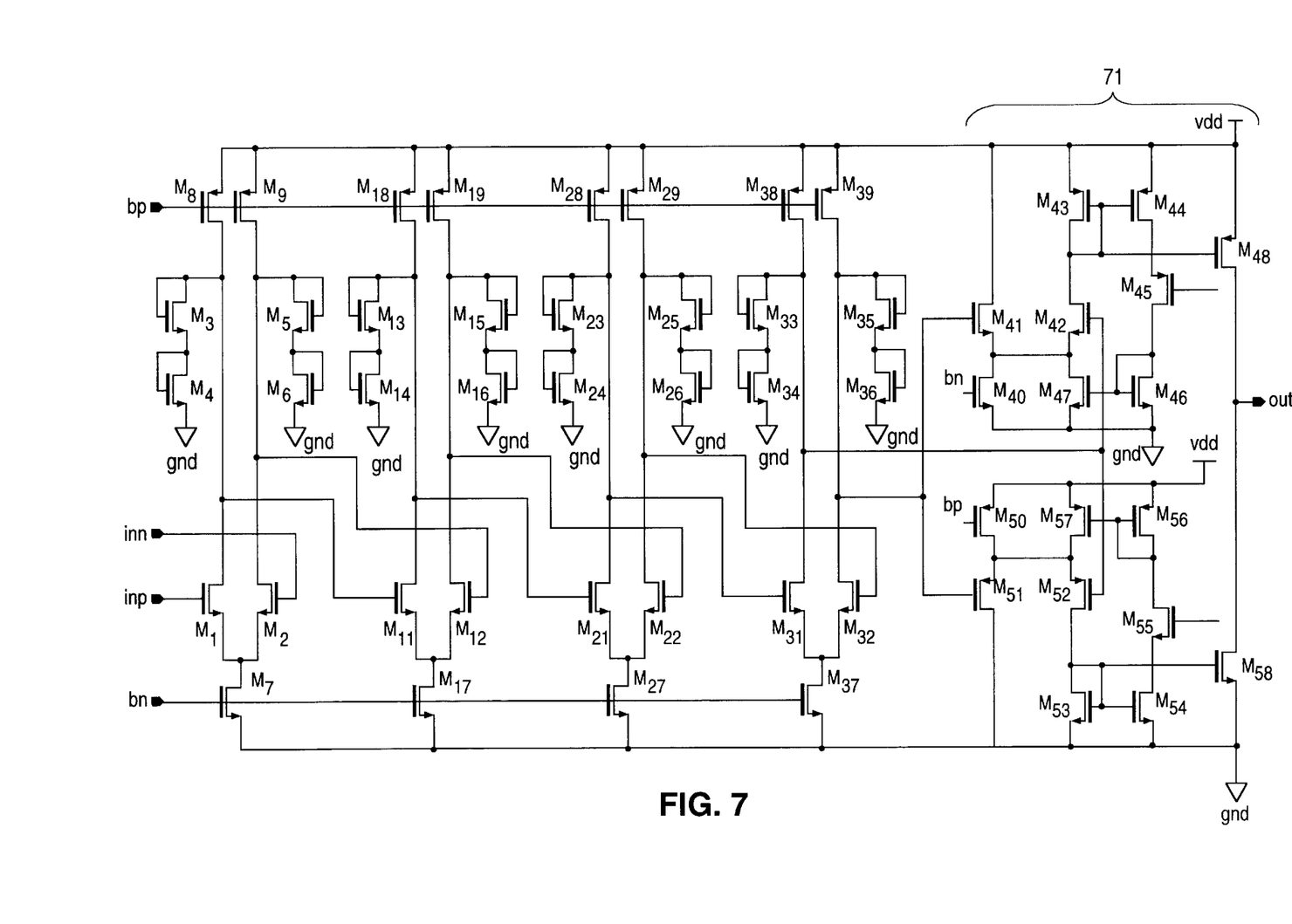
FIG. 7 illustrates a detailed circuit diagram of a reference buffer in accordance with one embodiment of the present invention.

FIG. 7 illustrates a complete circuit diagram of a reference buffer in accordance with one embodiment of the present invention. As shown, four fixed gain stages are implemented with MOS transistors $M_1$–$M_9$, $M_{11}$–$M_{19}$, $M_{21}$–$M_{29}$ and $M_{31}$–$M_{39}$. For further power savings, the output transconductance stage 71 implemented with transistors $M_{40-48}$ and $M_{50-58}$ has a symmetric adaptive biasing configuration. Additional information regarding adaptive biasing configuration can be found in M. Degrauwe et al., "Adaptive Biasing CMOS Amplifiers," IEEE Journal of Solid State Circuits, SC-17, (3), pp. 522–528 (1982).

The reference buffer disclosed above in accordance with the present invention is particularly suitable for used in high speed switched capacitor design. The present invention uses a large external capacitor as a charge reservoir and a very low power reference buffer to maintain a constant average voltage equal to the reference voltage. The thermal and switching noise are minimized by a triple bond connection to the external capacitor. The power savings achieved with this technique more than offsets the extra cost related to the external component and the IC pin. For example, total power dissipation for the designed buffer for a 12 bit/40 MHz A/D converter with an internal 10 pF switched capacitor is only 5 mW from a single 5 V supply (1 mA total current).

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a reference buffer, comprising:
   a first amplifier having first and second input terminals and an output terminal, said first amplifier first input terminal configured to receive a first reference signal;
   a common node;
   a capacitance coupled between said common node and a reference terminal;
   an output terminal;
   a first inductance coupled between said first amplifier output terminal and said common node;
   a second inductance coupled between said first amplifier second input terminal and said common node;
   a third inductance coupled to said common node and said output terminal;
   wherein said first inductance and said second inductance separate said first amplifier output terminal, and said first amplifier second input terminal, respectively, from said common node.

2. The apparatus of claim 1 wherein said first amplifier first input terminal is non-inverting and wherein said first amplifier second input terminal is inverting.

3. The apparatus of claim 1 further including a resistance coupled between said third inductance and a reference node.

4. An apparatus including a reference buffer, comprising:
   a first amplifier having first and second input terminals and an output terminal, said first amplifier first input terminal configured to receive a first reference signal;
   a second amplifier having a second amplifier first input terminal, a second amplifier second input terminal and a second amplifier output terminal;
   a common node;
   an output terminal;
   a first inductance coupled between said first amplifier output terminal and said common node;
   a second inductance coupled between said first amplifier second input and said common node; and
   a third inductance coupled to said common node and said output terminal;
   wherein said first inductance and said second inductance separate said first amplifier output terminal, and said first amplifier second input terminal, respectively, from said common node;
   wherein said second amplifier output terminal and said second amplifier second input terminal are coupled to said third inductance such that said second amplifier out put terminal and second amplifier second input terminal are separated from said common node; and further
   wherein said second amplifier first input terminal is configured to receive a second reference signal.

5. The apparatus of claim 4 wherein said first and second reference signals are equal.

6. The apparatus of claim 4 wherein said second amplifier first input terminal is non-inverting and wherein said second amplifier second input terminal is inverting.

7. The apparatus of claim 4 so wherein said first amplifier includes a voltage gain amplifier coupled to an adaptive biasing transconductance stage in series thereto, said voltage gain amplifier comprising:
   a first input transistor having first, second and third terminals, said first input transistor first terminal configured to receive said reference signal and said first input transistor second terminal configured to receive a first bias signal;
   a second input transistor having first, second and third terminals, said second input transistor second terminal configured to receive a second bias signal; and
   a plurality of diodes coupled to said second terminals of said first and second input transistors;
      wherein said second input transistor third terminal is coupled to said first input transistor third terminal, said third terminals further configured to receive a third bias signal.

8. The apparatus of claim 5 wherein said second amplifier first input terminal is non-inverting and wherein said second amplifier second input terminal is inverting.

9. The apparatus of claim 8 wherein said first amplifier includes a voltage gain amplifier coupled to an adaptive biasing transconductance stage in series thereto, said voltage gain amplifier comprising:
   a first input transistor having first, second and third terminals, said first input transistor first terminal configured to receive said reference signal and said first input transistor second terminal configured to receive a first bias signal;
   a second input transistor having first, second and third terminals, said second input transistor second terminal configured to receive a second bias signal; and
   a plurality of diodes coupled to said second terminals of said first and second input transistors;
      wherein said second input transistor third terminal is coupled to said first input transistor third terminal, said third terminals further configured to receive a third bias signal.

10. The apparatus of claim 6 wherein said first amplifier includes a voltage gain amplifier coupled to an adaptive biasing transconductance stage in series thereto, said voltage gain amplifier comprising:
   a first input transistor having first, second and third terminals, said first input transistor first terminal configured to receive said reference signal and said first input transistor second terminal configured to receive a first bias signal;
   a second input transistor having first, second and third terminals, said second input transistor second terminal configured to receive a second bias signal; and a plurality of diodes coupled to said second terminals of said first and second input transistors;
wherein said second input transistor third terminal is coupled to said first input transistor third terminal, said third terminals further configured to receive a third bias signal.

11. An apparatus including a reference buffer, comprising:
a first amplifier having first and second input terminals and an output terminal, said first amplifier first input terminal configured to receive a first reference signal;
a second amplifier having a second amplifier first input terminal, a second amplifier second input terminal and a second amplifier output terminal;
a common node;
an output terminal;
a first inductance coupled between said first amplifier output terminal and said common node;
a second inductance coupled between said first amplifier second input terminal and said common node;
a third inductance coupled to said common node and said output terminal;
wherein said first inductance and said second inductance separate said first amplifier output terminal, and said first amplifier second input terminal, respectively, from said common node;
wherein said second amplifier output terminal and said second amplifier second input terminal are coupled to said third inductance such that said second amplifier output terminal and second amplifier second input terminal are separated from said common node; and further
wherein said second amplifier first input terminal is configured to receive a second reference signal.

12. The apparatus of claim 11 wherein said first and second reference signals are equal.

13. The apparatus of claim 12 wherein said second amplifier first input terminal is non-inverting and wherein said second amplifier second input terminal is inverting.

14. The apparatus of claim 11 wherein said second amplifier first input terminal is non-inverting and wherein said second amplifier second input terminal is inverting.

15. An apparatus including a reference buffer, comprising:
a first amplifier having first and second input terminals and an output terminal, said first amplifier first input terminal configured to receive a first reference signal, said first amplifier including a voltage gain amplifier coupled in series to an adaptive biasing transconductance stage in series thereto;
a common node;
a capacitance coupled between said common node and a reference terminal;
an output terminal;
a first inductance coupled between said first amplifier output terminal and said common node;
a second inductance coupled between said first amplifier second input terminal and said common node;
a third inductance coupled to said common node and said output terminal;
wherein said first inductance and said second inductance separate said first amplifier output terminal, and said first amplifier second input terminal, respectively, from said common node.

16. An apparatus including a reference buffer, comprising:
a first amplifier having first and second input terminals and an output terminal, said first amplifier first input terminal configured to receive a first reference signal, said first amplifier including a voltage gain amplifier coupled in series to an adaptive biasing transconductance stage in series thereto;
a common node;
an output terminal;
a first inductance coupled between said first amplifier output terminal and said common node;
a second inductance coupled between said first amplifier second input terminal and said common node;
a third inductance coupled to said common node and said output terminal;
wherein said first inductance and said second inductance separate said first amplifier output terminal, and said first amplifier second input terminal, respectively, from said common node; and further
wherein said voltage gain amplifier comprises:
a first input transistor having first, second and third terminals, said first input transistor first terminal configured to receive said first reference signal and said first input transistor second terminal configured to receive a first bias signal;
a second input transistor having first, second and third terminals, said second input transistor second terminal configured to receive a second bias signal; and
a plurality of diodes coupled to said second terminals of said first and second input transistors;
wherein said second input transistor third terminal is coupled to said first input transistor third terminal, said third terminals further configured to receive a third bias signal.

17. The apparatus of claim 16 wherein said first and second input transistors are pMOS transistors.

18. The apparatus of claim 16 wherein said first and second input transistors are matched.

19. A method of providing a reference buffer, comprising the steps of:
providing a first amplifier having first and second input terminals and an output terminal, said first amplifier first input terminal configured to receive a first reference signal;
providing a second amplifier having a second amplifier first input terminal, a second amplifier second input terminal and a second amplifier output terminal;
providing a common node;
providing an output terminal;
coupling a first inductance between said first amplifier output terminal and said common node;
coupling a second inductance between said first amplifier second input and said common node; and
coupling a third inductance to said common node and said output terminal;
wherein said first inductance and said second inductance separate said first amplifier output terminal, and said first amplifier second input terminal, respectively, from said common node;
wherein said second amplifier output terminal and said second amplifier second input terminal are coupled to said third inductance such that said second amplifier output terminal and second amplifier second input terminal are separated from said common node; and further
wherein said second amplifier first input terminal is configured to receive a second reference signal.

20. The method of claim 19 wherein said first and second reference signals are equal.

21. The method of claim 20 wherein said second amplifier first input terminal is non-inverting and wherein said second amplifier second input terminal is inverting.

22. The method of claim 21 wherein said step of providing said first amplifier includes the step of coupling a voltage gain amplifier to an adaptive biasing transconductance stage in series thereto, said step of coupling said voltage gain amplifier comprising the steps of:

providing a first input transistor having first, second and third terminals, said first input transistor first terminal configured to receive said reference signal and said first input transistor second terminal configured to receive a first bias signal;

providing a second input transistor having first, second and third terminals, said second input transistor second terminal configured to receive a second bias signal; and coupling a plurality of diodes to said second terminals of said first and second input transistors;

wherein said second input transistor third terminal is coupled to said first input transistor third terminal, said third terminals further configured to receive a third bias signal.

23. The method of claim 19 wherein said second amplifier first input terminal is non-inverting and wherein said second amplifier second input terminal is inverting.

24. The method of claim 23 wherein said step of providing said first amplifier includes the step of coupling a voltage gain amplifier to an adaptive biasing transconductance stage in series thereto, said step of coupling said voltage gain amplifier comprising the steps of:

providing a first input transistor having first, second and third terminals, said first input transistor first terminal configured to receive said reference signal and said first input transistor second terminal configured to receive a first bias signal;

providing a second input transistor having first, second and third terminals, said second input transistor second terminal configured to receive a second bias signal; and coupling a plurality of diodes to said second terminals of said first and second input transistors;

wherein said second input transistor third terminal is coupled to said first input transistor third terminal, said third terminals further configured to receive a third bias signal.

25. The method of claim 19 wherein said step of providing said first amplifier includes the step of coupling a voltage gain amplifier to an adaptive biasing transconductance stage in series thereto, said step of coupling said voltage gain amplifier comprising the steps of:

providing a first input transistor having first, second and third terminals, said first input transistor first terminal configured to receive said reference signal and said first input transistor second terminal configured to receive a first bias signal;

providing a second input transistor having first, second and third terminals, said second input transistor second terminal configured to receive a second bias signal; and coupling a plurality of diodes to said second terminals of said first and second input transistors;

wherein said second input transistor third terminal is coupled to said first input transistor third terminal, said third terminals further configured to receive a third bias signal.

26. A method of providing a reference buffer, comprising the steps of:

providing a first amplifier having first and second input terminals and an output terminal, said first amplifier first input terminal configured to receive a first reference signal, said step of providing said first amplifier including the step of coupling a voltage gain amplifier in series to an adaptive biasing transconductance stage in series thereto;

providing a common node;

providing an output terminal;

coupling a first inductance between said first amplifier output terminal and said common node;

coupling a second inductance between said first amplifier second input terminal and said common node;

coupling a third inductance to said common node and said output terminal;

wherein said first inductance and said second inductance separate said first amplifier output terminal, and said first amplifier second input terminal, respectively, from said common node; and further wherein said step of coupling said voltage gain amplifier comprises the steps of:

providing a first input transistor having first, second and third terminals, said first input transistor first terminal configured to receive said first reference signal and said first input transistor second terminal configured to receive a first bias signal;

providing a second input transistor having first, second and third terminals, said second input transistor second terminal configured to receive a second bias signal; and coupling a plurality of diodes to said second terminals of said first and second input transistors;

wherein said second input transistor third terminal is coupled to said first input transistor third terminal, said third terminals further configured to receive a third bias signal.

27. The method of claim 26 wherein said first and second input transistors are pMOS transistors.

28. The method of claim 26 wherein said first and second input transistors are matched.

* * * * *